United States Patent
Mune et al.

(10) Patent No.: US 7,037,637 B2
(45) Date of Patent: *May 2, 2006

(54) PHOTOSENSITIVE POLYIMIDE RESIN PRECURSOR COMPOSITION, OPTICAL POLYIMIDE OBTAINED FROM THE COMPOSITION, OPTICAL WAVEGUIDE USING THE POLYIMIDE, AND PROCESS FOR PRODUCING THE OPTICAL WAVEGUIDE

(75) Inventors: Kazunori Mune, Ibaraki (JP); Amane Mochizuki, Ibaraki (JP); Shunichi Hayashi, Ibaraki (JP); Hirofumi Fujii, Ibaraki (JP); Takahiro Fukuoka, Ibaraki (JP); Ryusuke Naitou, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 254 days.

This patent is subject to a terminal disclaimer.

(21) Appl. No.: 10/424,772

(22) Filed: Apr. 29, 2003

(65) Prior Publication Data

US 2004/0013953 A1  Jan. 22, 2004

(30) Foreign Application Priority Data

Jul. 17, 2002  (JP) .................... P. 2002-208429

(51) Int. Cl.
*G03F 7/038* (2006.01)
*G02B 6/10* (2006.01)

(52) U.S. Cl. .............. 430/281.1; 430/285.1; 430/321; 385/143; 385/129; 385/130

(58) Field of Classification Search ......... 430/321, 430/281.1, 285.1; 385/143, 129, 130
See application file for complete search history.

(56) References Cited

U.S. PATENT DOCUMENTS

| | | | |
|---|---|---|---|
| 5,081,000 A | 1/1992 | Kuehn et al. | |
| 5,317,082 A | 5/1994 | Beuhler et al. | |
| 5,719,253 A * | 2/1998 | Echigo et al. | 528/182 |
| 5,849,934 A * | 12/1998 | Ando et al. | 549/241 |
| 6,047,098 A * | 4/2000 | Sagawa et al. | 385/141 |
| 6,549,714 B1 * | 4/2003 | Kim et al. | 385/143 |
| 6,746,816 B1 * | 6/2004 | Hayashi et al. | 430/270.1 |
| 6,800,425 B1 * | 10/2004 | Naitou et al. | 430/321 |
| 2002/0051614 A1 * | 5/2002 | Teramoto et al. | 385/129 |
| 2003/0108748 A1 * | 6/2003 | Shigeta et al. | 428/425.8 |
| 2004/0131324 A1 * | 7/2004 | Mune et al. | 385/129 |
| 2004/0146263 A1 * | 7/2004 | Mune et al. | 385/129 |
| 2004/0178522 A1 * | 9/2004 | Oe et al. | 264/1.25 |

FOREIGN PATENT DOCUMENTS

| | | | |
|---|---|---|---|
| EP | 1103855 | * | 5/2001 |
| EP | 1 205 804 A2 | | 5/2002 |
| JP | 2002-356615 | * | 12/2002 |

* cited by examiner

*Primary Examiner*—Martin Angebranndt
(74) *Attorney, Agent, or Firm*—Sughrue Mion, PLLC

(57) ABSTRACT

A photosensitive polyimide resin precursor composition capable of providing a polyimide resin that is not substantially colored, is transparent and has heat resistance, an optical polyimide resin obtained from the composition, and an optical waveguide using the polyimide resin. The photosensitive polyimide resin precursor composition contains (a) 100 parts by weight of a polyamic acid obtained from a tetracarboxylic acid dianhydride and a diamine, (b) 0.01 parts by weight or more and less than 5 parts by weight of a 1,4-dihydropyridine derivative, (c) 5–50 parts by weight of a glycol (ether). The optical polyimide resin is obtained by irradiating the photosensitive resin precursor composition with UV light, followed by exposure, heating, development, and then heating. The optical waveguide comprises a core layer comprising the optical polyimide resin, and a cladding layer thereof.

14 Claims, 3 Drawing Sheets ered resin precursor composition is coated on a substrate such as a silicon wafer by spin coating or casting and heated to prepare a photosensitive polyimide resin precursor composition film. Thereafter, the resulting film is exposed to a light through a photomask having a required pattern. When the film is then developed with a developing solution, a desired pattern is obtained. Thereafter, the resulting pattern is heated to cyclize the polyamic acid as the polyimide resin precursor, thereby forming an optical circuit.

PHOTOSENSITIVE POLYIMIDE RESIN PRECURSOR COMPOSITION, OPTICAL POLYIMIDE OBTAINED FROM THE COMPOSITION, OPTICAL WAVEGUIDE USING THE POLYIMIDE, AND PROCESS FOR PRODUCING THE OPTICAL WAVEGUIDE

FIELD OF THE INVENTION

The present invention relates to a photosensitive polyimide resin precursor composition, an optical polyimide resin obtained from the composition, an optical waveguide using the polyimide resin, and a process for producing the optical waveguide. Particularly, the invention relates to a photosensitive polyimide resin precursor composition capable of providing a transparent optical polyimide resin having a small birefringent index, which can be suitably used for optical waveguides, optical waveguide devices, optical integrated circuits, optical wirings, etc. as broadly used in optical communication, optical information processing, and other general optical fields, an optical polyimide resin obtained from such a photosensitive polyimide resin precursor composition, a optical waveguide obtained by using such an optical polyimide resin as a core layer, and a process for producing the optical waveguide.

DESCRIPTION OF THE RELATED ART

With the progress of practical application of optical communication system by development of optical fibers, development of various optical communication devices using an optical waveguide structure is demanded. In general, optical waveguide materials are required to have characteristics such that they have a low light propagation loss, have heat resistance and humidity resistance, and can control a refractive index and a film thickness. In order to meet these requirements, quartz-based optical waveguides have hitherto been chiefly investigated.

However, in constructing optical fiber networks inclusive of WDM communication, it is essential to realize a reduction of the production cost of various devices. Accordingly, in order to apply polymer materials that can be mass-produced and processed with a large area to optical waveguide materials, in recent years, organic materials inclusive of polymethyl methacrylates, polycarbonates and polystyrenes are investigated. However, in the case where these polymers are subjected to hybrid integration with a laser diode, a photo diode, etc., their heat resistance in a solder reflow step is not sufficient, and therefore, they involve a defect such that the range of use is very limited. Among a number of high molecular weight materials, polyimide resin-based materials have highest heat resistance, and hence, recently attract a great deal of attention as an optical waveguide material.

Hitherto, optical circuits made of a polyimide resin have been generally formed by the following dry process. That is, a polyamic acid as a polyimide resin precursor is first dissolved in a polar solvent such as N,N-dimethylacetamide and N-methyl-2-pyrrolidone, to prepare a polyamic acid varnish; the varnish is applied on a substrate by spin coating or casting; the applied varnish is heated to remove the solvent and also cyclize the polyamic acid for imidation, thereby forming a polyimide resin film; and the polyimide resin film is then subjected to reactive ion etching (RIE) with oxygen plasma, etc., to form a pattern.

However, according to such conventional dry process, not only it takes a long period of time to form an optical circuit, but also the problem of realizing a reduction of the production cost is not solved yet because the processing region is restricted. Further, according to such dry process, since a wall surface (side surface) of the formed pattern is not flat, a scattering loss becomes large during wave guiding of a light into the optical circuit.

In addition, according to the conventional dry process, the polyimide resin film is coated with a resist layer corresponding to a required pattern; a region not coated with the resist layer is irradiated with ions from the upper side; the pattern is left by etching; and thereafter, the resist is dissolved and removed, to obtain the required pattern made of the polyimide resin. Thus, according to such dry process, since the irradiation direction of ions is a single direction, the etching proceeds in a single direction, and as a result, the resulting pattern has a square cross-sectional shape. However, derived from resolution, adhesiveness and material brittleness of the resist, the side surface of the resulting pattern is not smooth but is found to have fine irregularities. When such a pattern is used as a core of an optical waveguide, it is known that the irregularities of the side surface cause light scattering and influence the transmission that is important for the optical waveguide.

In contrast, as described in JP-A-6-43648, JP-A-7-179604, and JP-A-7-234525, when a polyimide resin is formed by a wet process using a photosensitive polyimide resin precursor composition having a 1,4-dihydropyridine derivative as a photosensitive compound compounded therein, the foregoing problems are not found. However, a new problem in light loss of the resulting polyimide resin must be solved.

That is, in order to use the polyimide resin by the wet process as an optical waveguide material, it is essential that the polyimide resin does not absorb a light to be guided, i.e., it is low in loss to the light, and in summary, it has transparency.

In forming the polyimide resin by a wet process, in order to impart sensitivity to a polyamic acid as a polyimide resin precursor, there has hitherto been employed a method in which the photosensitive compound is compounded in an amount ranging from 5 to 70 parts by weight based on 100 parts by weight of the polyamic acid, and the photosensitive polyimide resin precursor composition is heated to cyclize and cure (imidate) the polyamic acid. In the cyclization and curing stages, the photosensitive compound causes heat decomposition to color the resulting polyimide resin black.

Materials that are used for the manufacture of optical waveguide are required to be transparent in a region ranging from a visible light to a near infrared light. However, since the polyimide resin by the wet process partly absorbs a light in not only a visible light region but also a near infrared light region, it is hardly used as the optical waveguide material.

Then, in order to solve the problems occurred in the case where the polyimide resin by the wet process is put into the optical use, the present inventors made extensive and intensive investigations. As a result, it has been found that light absorption of the polyimide resin in a near infrared light region such as a 1.3 µm-band or 1.55 µm-band that is used as a communication wavelength is due to a C—H bond in the resulting polyimide resin.

That is, in the conventional wet process, according to the description of JP-A-6-43648, the 1,4-dihydropyridine derivative is compounded as the photosensitive compound in an amount ranging from 5 to 50 parts by weight based on 100 parts by weight of the polyamic acid as a precursor of the polyimide resin, to form a photosensitive polyimide resin precursor composition, and the photosensitive polyimide resin precursor composition is irradiated with light, exposed and heated, and then developed, heated and cured (imidated) to form a pattern made of the polyimide resin. However, the present inventors found that by reducing the compounding amount of the photosensitive compound to less than 5 parts by weight based on 100 parts by weight of the polyamic acid, the coloration of the polyimide resin in the heating and curing (imidating) stages based on the decomposition of the photosensitive compound can be greatly reduced. Especially, the present inventors found that by introducing a fluorine atom into raw materials (i.e., a tetracarboxylic acid dianhydride and a diamine) for the polyamic acid, even when the amount of the photosensitive compound to be compounded in the resulting polyamic acid is extremely reduced, effective sensitivity can be kept, thereby enabling to form the pattern.

In addition, the present inventors found that even when the addition amount of the photosensitive compound to the polyamic acid obtained from the tetracarboxylic anhydride and the diamine each having a fluorine atom is made low, by compounding at least one glycol (ether) selected from polyethylene glycol, polyethylene glycol monomethyl ether, polyethylene glycol dimethyl ether, polyethylene glycol monophenyl ether, polyethylene glycol diphenyl ether, polypropylene glycol, polypropylene glycol monomethyl ether, polypropylene glycol dimethyl ether, polypropylene glycol monophenyl ether, and polypropylene glycol diphenyl ether, if the resulting photosensitive polyimide resin precursor composition is irradiated with light, a remarkable difference in solubility in a developing solution between an exposed area and an unexposed area is generated during the development, and hence, a high contrast can be obtained upon development of the light-irradiated polyimide resin precursor composition, i.e., the foregoing glycol ether is useful as a dissolution controlling agent and a contrast enhancer.

Further, in the case where the polyimide resin by the wet process of the foregoing photosensitive polyimide resin precursor composition is used as an optical waveguide material, especially in the case where it is used as a core layer of the optical waveguide, there is a problem in cross-sectional shape of the pattern, in addition to the problem in light loss.

In general, according to the conventional wet process, the polyimide resin film is coated with a resist layer corresponding to a required pattern, and a region not coated with the resist layer is dissolved with a developing solution to obtain a pattern. In such wet process, etching of the resin film proceeds in the thickness direction of the resin film and simultaneously proceeds in the surface direction of the resin film. Thus, in the ultimately obtained pattern, since a pattern width is different between an upper surface and a lower surface of the film, the cross-sectional shape of the resulting pattern is a trapezoid convex upwardly with a bottom angle α of about 60–80° but not a square shape, as shown in FIG. 1.

In the foregoing wet process (development) using the photosensitive polyimide resin precursor composition, a resist is not used, but the pattern formation is carried out by utilizing a difference in solubility in a developing solution between an exposed area and an unexposed area. Accordingly, the cross-sectional shape of the resulting pattern is basically a trapezoid convex upwardly as in the pattern formation by the usual wet process.

Here, the cross-sectional shape of a core layer of an ideal optical waveguide is a circle having a highest symmetry like optical fibers. However, in the most of optical waveguides inclusive of planar lightwave circuits (PLC), it is difficult to make the cross-sectional shape of the core circular due to the manufacturing process thereof. Accordingly, as shown in FIG. 2, it is demanded to realize a cross-sectional shape of a square with a good symmetry as far as possible. It may be considered that the square cross-sectional shape is promising from the standpoint of minimizing a mismatching of mode in the connection section with a fiber.

In order to solve the forgoing problems occurred in the case where the polyimide resin by the wet process is provided for the optical use, the present inventors made extensive and intensive investigations. As a result, it has been found that by further regulating the compounding amount of the dissolution controlling agent, when the photosensitive polyimide resin precursor composition is irradiated with a UV light, exposed, heated and then developed, since a remarkable difference in solubility in the developing solution between an exposed area and an unexposed area can be generated, it is possible to obtain a very large contrast between the exposed area and the unexposed area. Thus, according to the invention, by the wet process of a photosensitive polyimide resin precursor composition, it is possible to obtain a pattern having a square cross-section shape as shown in FIG. 2, which has hitherto been difficultly provided, and even a pattern having a square cross-section having an aspect ratio exceeding 1 as the case may be.

As described above, the present inventors have found that by using a photosensitive polyimide resin precursor composition comprising a polyamic acid obtained from a tetracarboxylic acid dianhydride and a diamine, each of which preferably contains a fluoride atom in the molecule, having a photosensitive compound and a dissolution controlling agent compounded therein, a polyimide resin obtained from the photosensitive polyimide resin precursor composition can be suitably used for optical applications, and particularly, patterns having a high transparency required as optical waveguide materials and even having a square cross-section by the wet process according to a preferred embodiment, leading to accomplishment of the invention.

SUMMARY OF THE INVENTION

Accordingly, the invention has been made to overcome various problems including the production cost encountered in the conventional optical waveguide materials as well as the above-described problems encountered in polyimide resins obtained by the wet process using a conventional photosensitive compound.

One object of the invention is to provide a photosensitive polyimide resin precursor composition capable of providing a transparent polyimide resin necessary as an optical waveguide material.

Another object of the invention is to provide a transparent optical polyimide resin having heat resistance obtained from the composition.

Still another object of the invention is to provide an optical device, especially an optical waveguide, obtained by using the polyimide resin.

Further object of the invention is to provide a process for producing the optical waveguide.

According to a first embodiment of the invention, there is provided a photosensitive polyimide resin precursor composition comprising:

(a) 100 parts by weight of a polyamic acid obtained from a tetracarboxylic dianhydride and a diamine, (b) 0.01 parts by weight or more and less than 5 parts by weight of a 1,4-dihydropyridine derivative represented by the following formula (I):

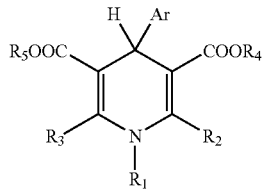

wherein Ar represents an aromatic group having a nitro group at ortho-position with respect to a bonding position to 1,4-dihydropyridine ring; $R_1$ represents hydrogen atom or an alkyl group having 1–3 carbon atoms; and $R_2$, $R_3$, R4, and $R_5$ each independently represent hydrogen atom or an alkyl group having 1 or 2 carbon atoms, and (c) 5–50 parts by weight of at least one glycol (ether) having a weight average molecular weight of 100–3,000 selected from the group consisting of polyethylene glycol, polyethylene glycol monomethyl ether, polyethylene glycol dimethyl ether, polyethylene glycol monophenyl ether, polyethylene glycol diphenyl ether, polypropylene glycol, polypropylene glycol monomethyl ether, polypropylene glycol dimethyl ether, polypropylene glycol monophenyl ether, and polypropylene glycol diphenyl ether.

According to a second embodiment of the invention, there is provided an optical polyimide resin obtained by applying the photosensitive polyimide precursor composition to a surface of a substrate; drying the coating to form a resin film comprising the photosensitive polyimide resin precursor composition; irradiating the resin film with UV light through a mask so as to obtain a desired pattern, followed by exposure; heating the resin film at 160–200° C. in air; developing the resin film with a developing solution to obtain the pattern, and heating the pattern at 300–400° C. to imidate the pattern, thereby obtaining the pattern comprising the polyimide resin.

According to a third embodiment of the invention, there is provided an optical waveguide comprising a core layer comprising the optical polyimide resin, and a cladding layer thereof.

According to a fourth embodiment of the invention, there is provided a process for producing a optical waveguide, which comprises:

applying a photosensitive polyimide resin precursor composition comprising:

(a) 100 parts by weight of a polyamic acid obtained from a tetracarboxylic dianhydride and a diamine, (b) 0.01 parts by weight or more and less than 5 parts by weight of a 1,4-dihydropyridine derivative represented by the following formula (I) as a photosensitive compound:

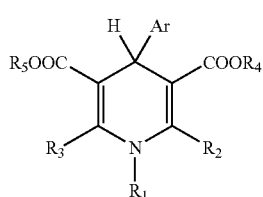

wherein Ar represents an aromatic group having a nitro group at ortho-position with respect to a bonding position to 1,4-dihydropyridine ring; $R_1$ represents hydrogen atom or an alkyl group having 1–3 carbon atoms; and $R_2$, $R_3$, $R_4$, and $R_5$ each independently represent hydrogen atom or an alkyl group having 1 or 2 carbon atoms, and (c) 5–50 parts by weight of at least one glycol (ether) having a weight average molecular weight of 100–3,000 selected from the group consisting of polyethylene glycol, polyethylene glycol monomethyl ether, polyethylene glycol dimethyl ether, polyethylene glycol monophenyl ether, polyethylene glycol diphenyl ether, polypropylene glycol, polypropylene glycol monomethyl ether, polypropylene glycol dimethyl ether, polypropylene glycol monophenyl ether, and polypropylene glycol diphenyl ether, as a dissolution controlling agent;

on a substrate to form a photosensitive resin film;

irradiating the photosensitive resin film with a UV light through a mask, followed by exposure, heating, development, and heating to form a core layer having a square cross-section.

1: substrate

Figure 1:
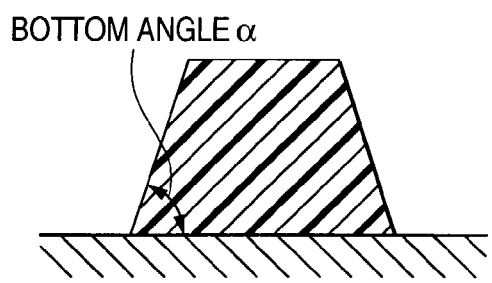
FIG. 1 shows a usual cross-sectional shape of a pattern obtained by a wet process of a polyimide resin film.
Figure 2:
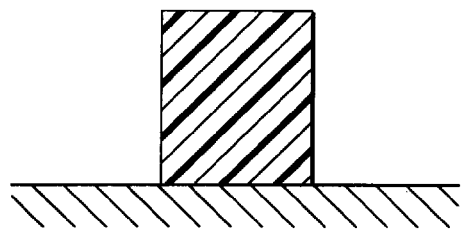
FIG. 2 shows a square cross-sectional shape of a pattern obtained by a wet process of a polyimide resin film according to the invention.

2: resin film comprising photosensitive polyimide resin precursor composition

3: glass mask

4: core layer (core pattern layer)

5: overcladding layer

6: substrate

7: undercladding layer

8: resin film comprising photosensitive polyimide resin precursor composition

9: core layer

10: overcladding layer

DETAILED DESCRIPTION OF THE INVENTION

The photosensitive polyimide resin precursor composition according to the invention comprises a polyamic acid obtained from a tetracarboxylic anhydride and a diamine; a 1,4-dihydropyridine derivative represented by the above formula (I) as a photosensitive compound; and as a dissolution controlling agent, at least one glycol (ether) selected from polyethylene glycol, polyethylene glycol monomethyl ether, polyethylene glycol dimethyl ether, polyethylene glycol monophenyl ether, polyethylene glycol diphenyl ether, polypropylene glycol, polypropylene glycol monomethyl ether, polypropylene glycol dimethyl ether, polypropylene glycol monophenyl ether, and polypropylene glycol diphenyl ether.

The tetracarboxylic dianhydride that can be used in the invention is not particularly limited, and examples thereof include pyromellitic anhydride, 3,3',4,4'-biphenyltetracarboxylic dianhydride, 2,2-bis(2,3-dicarboxyphenyl)propane dianhydride, 2,2-bis(3,4-dicarboxyphenyl)propane dianhydride, 3,3',4,4'-benzophenonetetracrboxylic dianhydride, bis(3,4-dicarboxylphenyl)ether dianhydride, and bis(3,4-dicarboxyphenyl)sulfonic dianhydride.

The tetracarboxylic dianhydride preferably contains a fluorine atom in the molecule thereof (hereinafter referred to as "fluorine-substituted tetracarboxylic dianhydride). Examples of the fluorine-substituted tetracarboxylic dianhydride include 2,2-bis(3,4-dicarboxyphenyl)hexafluoropropane dianhydride, 4,4-bis(3,4-dicarboxytrifluorophenoxy)tetrafluorobenzene dianhydride, 1,4-bis(3,4-dicarboxytrifluorophenoxy)tetrafluorobenzene dianhydride, (trifluoromethyl)pyromellitic dianhydride, di(trifluoromethy)pyromellitic dianhydride, and di(heptafluoropropyl)pyromellitic dianhydride.

Examples of the diamine include m-phenylenediamine, p-phenylenediamine, 3,4'-diaminodiphenyl ether, 4,4'-diaminodiphenyl ether, 4,4'-diaminodiphenylsulfone, 3,3'-diaminodiphenylsulfone, 2,2-bis(4-aminophenoxyphenyl)propane, 1,3-bis-(4-aminophenoxyl)benzene, 1,4-bis(4-aminophenoxy)benzene, 2,4-diaminotoluene, 2,6-diaminotoluene, 4,4'-diaminodiphenylmethane, and 4,4'-diamino-2,2'-diphenylbiphenyl.

Similar to the tetracarboxylic dianhydride, the diamine preferably contains a fluorine atom in the molecule thereof (hereinafter referred to as "fluorine-substituted diamine"). Examples of the fluorine-substituted diamine include 2,2'-bis(trifluoromethoxy)-4,4'-diaminobiphenyl (TFMOB), 3,3'-diamino-5,5'-bis(trifluoromethyl)biphenyl, 2,2-bis(4-aminophenyl)hexafluoropropane (BAAF), 2,2-bis[4-(4-aminophenoxy)phenyl]hexafluoropropane (HFBAPP), 2,2'-bis(trifluoromethyl)-4,4'-diaminobiphenyl (TFMB), 2,2-bis(3-amino-4-hydroxyphenyl)hexafluoropropane (BIS-AP-AF), 2,2-bis(3-amino-4-methylphenyl)hexafluoropropane (BIS-AT-AF), 2,2'-difluorobenzidine (FBZ), 4,4'-bis-(aminooctafluoro)biphenyl, 3,5-diaminobenzotrifluoride, and 1,3-diamino-2,4,5,6-tetrafluorobenzene.

The polyamic acid can be obtained by reacting the tetracarboxylic acid dianhydride and diamine in the conventional manner. For example, a solution having the diamine dissolved in an appropriate organic solvent and an equimolar amount to the diamine of the tetracarboxylic dianhydride are mixed under a nitrogen atmosphere, and the mixture is stirred at room temperature for about 5–20 hours, whereby a solution of the polyamic acid can be obtained as a viscous solution.

The organic solvent is not particularly limited so long as it has hitherto been used for the production of polyamic acids. For example, polar solvents such as N,N-dimethylacetamide (DMAc) and N-methyl-2-pyrrolidone (NMP) are preferably used, and DMAc is particularly preferably used from the points that it does not thermally decompose and has excellent transparency.

Of the polyamide resins obtained as above, a polyimide resin obtained by using a polyamic acid having a repeating unit represented by the following formula (II):

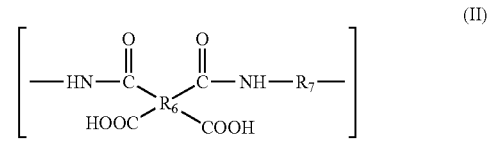

wherein $R_6$ represents at least one tetravalent group selected from the group consisting of tetravalent groups represented by the following formulae (IIa), (IIb), (IIc), (IId) and (IIe):

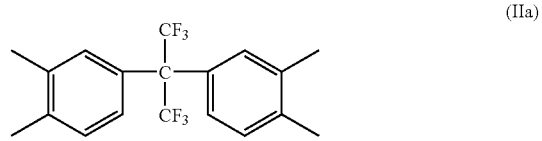

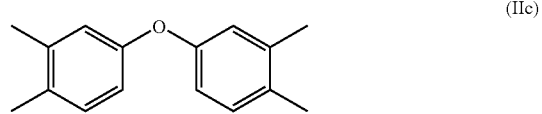

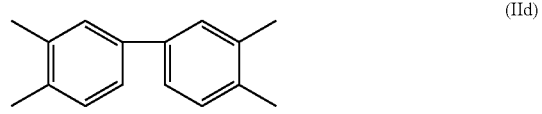

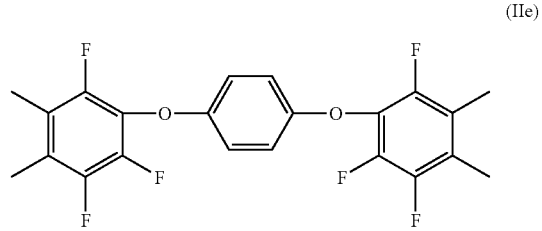

and $R_7$ represents at least one divalent group selected from the group consisting of divalent groups represented by the following formulae (IIf), (IIg), (IIh) and (IIi):

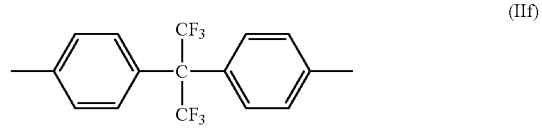

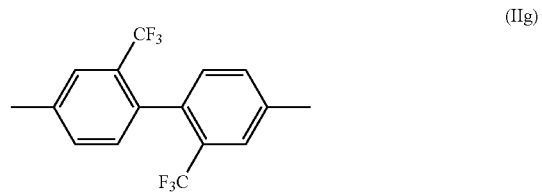

-continued

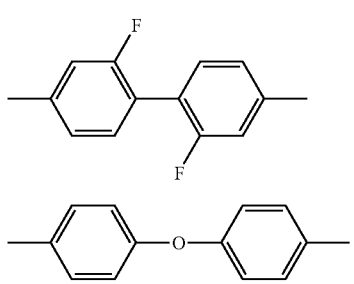

(IIh)

(IIi)

is preferable because of its low refractive index. Further, in the case where this polyimide resin is used as a core layer of an optical waveguide, it is easy to regulate a relative refractive index difference between the core layer and a clad.

Examples of the 1,4-dihydropyridine derivative as the photosensitive compound include 1-ethyl-3,5-dimethoxycarbonyl-4-(2-nitrophenyl)-1,4-dihydropyridine, 1-methyl-3,5-dimethoxycarbonyl-4-(2-nitrophenyl)-1,4-dihydropyridine, 1-propyl-3,5-dimethoxycarbonyl-4-(2-nitrophenyl)-1,4-dihydropyridine, and 1-propyl-3,5-diethoxycarbonyl-4-(2-nitrophenyl)-1,4-dihydropyridine.

Of the above various 1,4-dihydropyridine derivatives, 1-ethyl-3,5-dimethoxy-carbonyl-4-(2-nitrophenyl)-1,4-dihydropyridine (hereinafter referred to as "EDHP") is preferably used as the photosensitive compound from the standpoints of low cost and low light absorption by C—H bond.

The 1,4-dihydropyridine derivative can be obtained by, for example, reacting a substituted benzaldehyde, two molar times of an alkyl propiolate (propargylic acid alkyl ester), and a corresponding primary amine in glacial acetic acid under reflux (*Khim. Geterotsikl. Soed.*, pp. 1067–1071, 1982).

The 1,4-dihydropyridine derivative as the photosensitive compound is used in an amount of 0.01 part by weight or more and less than 5 parts by weight, and preferably 0.05–2 parts by weight, per 100 parts by weight of the polyamic acid. If the photosensitive polyimide resin precursor composition is prepared by using the photosensitive compound in an amount of 5 parts by weight or more per 100 parts by weight of the polyamic acid, the resulting polyimide resin causes light absorption in a near infrared light region. On the other hand, if the amount of the photosensitive compound used is less than 0.01 part by weight per 100 parts by weight of the polyamic acid, when the resulting photosensitive polyimide resin precursor composition is irradiated with a UV light and developed to form a pattern, it is impossible to obtain a sufficient contrast.

The photosensitive polyimide resin precursor composition according to the invention can decrease the amount of the photosensitive compound added to the polyamic acid, and also decrease the exposure amount itself for exposing the resulting photosensitive polyimide resin precursor composition, compared with that in the conventional polyimide resin precursor compositions. Specifically, an appropriate exposure amount in the conventional photosensitive polyimide resin precursor compositions is 300–1,000 mH/cm², whereas the photosensitive polyimide resin precursor composition according to the invention makes it possible to attain sufficient resolution by an exposure amount in the range of 5–20 mJ/cm².

As described above, according to the invention, the transparency of the polyamic acid is improved by introducing a fluorine atom into the structure of the polyamic acid. As a result, even when the proportion of the photosensitive compound to the polyamic acid is reduced, and further, the exposure amount is also decreased, a sufficient sensitivity to light is attained, and after exposure, a high contrast is given during the development.

According to the invention, the glycol (ether) is compounded with the polyamic acid as a dissolution controlling agent together with the photosensitive compound, to obtain the photosensitive polyimide resin precursor composition.

The glycol (ether) used as the dissolution controlling agent is at least one member selected from the group consisting of polyethylene glycol, polyethylene glycol monomethyl ether, polyethylene glycol dimethyl ether, polyethylene glycol monophenyl ether, polyethylene glycol diphenyl ether, polypropylene glycol, polypropylene glycol monomethyl ether, polypropylene glycol dimethyl ether, polypropylene glycol monophenyl ether, and polypropylene glycol diphenyl ether.

The glycol (ether) used as the dissolution controlling agent has a weight average molecular weight of generally 100–3,000, preferably 200–2,000, and more preferably 300–1,000.

According to the invention, during heating and curing (imidating) the polyamic acid, the dissolution controlling agent is volatilized from the resin together with the residual solvent and does not ultimately remain in the resin. Accordingly, the dissolution controlling agent does not adversely affect the characteristics required for optical resins, such as transparency of the polyimide resin to be formed.

The dissolution controlling agent is used is in an amount of 5–50 parts by weight, preferably 20–40 parts by weight, and more preferably 25–35 parts by weight, per 100 parts by weight of the polyamic acid. If the amount of the dissolution controlling agent used is less than 5 parts by weight per 100 parts by weight of the polyamic acid, when a resin film comprising the resulting photosensitive polyimide resin precursor composition is exposed and then developed, an effect for suppressing reduction in the resin film thickness is poor, and a film remainder rate after the development is usually 50% or less. Further, the cross-sectional shape of the resulting pattern is a trapezoid convex upwardly. On the other hand, if the amount of the dissolution controlling agent used exceeds 50 parts by weight per 100 parts by weight of the polyamic acid, compatibility with the polyamic acid deteriorates so that there is the possibility that the resolution is decreased.

According to the invention, use of the dissolution controlling agent causes a remarkable difference in solubility to the developing solution between an exposed area and an unexposed area of the resin film when the resin film comprising the resulting photosensitive polyimide resin precursor composition is irradiated with light, exposed and then developed. As a result, during the development, the unexposed area can be dissolved away without substantially dissolving the exposed area, so that the film remainder rate can be enhanced.

According to a preferred embodiment, it is possible to control the shape of the resulting pattern by selecting the compounding amount of the dissolution controlling agent. Specifically, when the dissolution controlling agent is used in an amount of 20–40 parts by weight, and preferably 25–35 parts by weight, per 100 parts by weight of the polyamic acid, it is possible to ensure a film remainder rate of 80% or more, and it is also possible to make the cross-sectional shape of the pattern square. Thus, it is possible to form patterns having a square cross-sectional shape (aspect ratio: 1) or a longitudinal cross-sectional shape (aspect ratio: 1 or more) by wet etching, an aspect of which having conventionally been difficult to obtain.

Thus, use of an appropriate compounding amount of the dissolution controlling agent causes a large difference in solubility to the developing solution between an exposed area and an unexposed area of the resin film when the resin film comprising the resulting photosensitive polyimide resin precursor composition is irradiated with light, exposed and then developed. As a result, during the development, the unexposed area can be dissolved away without substantially dissolving the exposed area, so that it is possible to control the shape of the resulting pattern.

Compounding the photosensitive compound and the dissolution controlling agent with the polyamic acid can obtain a photosensitive polyimide resin precursor composition having high photosensitivity. Such a photosensitive polyimide resin precursor composition makes it possible to undergo processing with a large area. That is, since the conventional pattern formation in optical elements is performed by the dry process inclusive of reactive ion etching as described above, it takes a long period of time of works and is poor in mass production. On the other hand, the pattern formation using the photosensitive polyimide resin precursor composition according to the invention is free from these defects and can greatly reduce the processing cost.

The surface of the pattern obtained by wet etching of the photosensitive polyimide resin precursor composition according to the invention is very smooth, including its side surfaces. Accordingly, the surface of the pattern obtained by wet etching of the photosensitive polyimide resin precursor composition according to the invention is free from light scattering due to irregularities of the side surfaces of the pattern, which has been problematic in the conventional dry process inclusive of reactive ion etching, and is extremely superior in transparency (light transmittance).

The optical polyimide resin according to the invention can be obtained from such a photosensitive polyimide resin precursor composition. More specifically, for example, the photosensitive polyimide resin precursor composition is applied to the surface of a substrate such as a silicon substrate, a quartz substrate, a metal foil, a glass sheet or a polymer film, and initially dried to form a resin film comprising the photosensitive polyimide resin precursor composition. The resin film is irradiated with a UV light through a glass mask so as to obtain a desired pattern. Subsequently, The resin film is usually exposed and then heated in air at a temperature of 160–200° C., and preferably 170–190° C. in order to complete the photoreaction in the resin film. The resin film is then further heated to imidate the resulting desired pattern. The heating temperature is usually in a range of 300–400° C., thereby undergoing desolvation and curing reaction in vacuo or in a nitrogen atmosphere. Thus, a pattern comprising the polyimide resin can be obtained. The film thickness of the polyimide resin can be controlled by the concentration of the solids content and viscosity of the photosensitive polyimide resin precursor composition, the film formation conditions, etc.

The method for applying the photosensitive polyimide resin precursor composition to the surface of the substrate is not particularly limited, and general film formation methods such as spin coating or casting can be employed. Further, an alkaline aqueous solution is usually used as the developing solution used for the development.

Optical articles such as optical waveguides can be prepared by forming the desired pattern on the substrate. For example, with respect to the optical waveguide, an overcladding layer comprising other polyimide resin is formed on the pattern obtained, whereby a channel type optical waveguide structure can be prepared. Further, in the case of obtaining a flexible optical waveguide, it can be prepared by removing the substrate or overcladding layer by etching or the like.

Thus, the invention can collectively produce colorless and transparent optical waveguides with a large area at low production cost by forming a polyimide resin having a pattern using the photosensitive polyimide resin precursor composition.

Examples of the optical waveguide according to the invention include straight optical waveguides, bend multi-layered optical waveguides, crossing optical waveguides, Y-branched optical waveguides, slab optical waveguides, Mach-Zehnder type optical waveguides, AWG type optical waveguides, grating optical waveguides, and optical waveguide lenses. Examples of optical elements using such a optical waveguide include wavelength filters, optical switches, optical branch units, optical multiplexers, optical multiplexers/demultiplexers, optical amplifiers, wavelength modulators, wavelength division multiplexers, optical splitters, directional couplers, and optical transmission modules having a laser diode or a photodiode hybrid integrated therewith. Further, the guide according to the invention can be formed on the conventional electric wiring board.

The production process of the optical waveguide using the photosensitive polyimide resin precursor composition according to the invention will be described below.

The production process of the optical waveguide according to the invention is the same as the general production process of optical waveguides, except that the pattern formation is directly performed utilizing the photosensitivity of the photosensitive polyimide resin precursor composition. Accordingly, plan optical waveguides, ridge type optical waveguides, channel type optical waveguides, etc., can be produced in the same method. The photosensitive polyimide resin precursor composition can be applied to any of core layer forming materials, undercladding layer forming materials, and overcladding layer forming materials, or can simultaneously applied to those. In the case of simultaneously applying to the core layer forming material and the cladding layer forming material, it is possible to provide a difference in refractive index therebetween of about 0.2–1.0% by changing the tetracarboxylic acid dianhydride or diamine used, or changing the copolymerization composition ratio in the case of producing, for example, a single mode optical waveguide.

In the optical waveguide, the refractive index of the core layer must be higher than that of the cladding layer. Usually, a refractive index difference Δ therebetween may be sufficient as being about 0.2–1.0% in the case of a single mode. The refractive index difference Δ is expressed by the following equation:

$$\Delta = ((n(\text{core}) - n(\text{clad}))/n(\text{core})) \times 100(\%)$$

wherein "n(core)" represents a refractive index of the core layer, and "n(clad)" represents a refractive index of the cladding layer.

The method for regulating the refractive index of the polyimide resin is, for example, a method in which a polyamic acid which is a precursor of the polyimide resin is produced using a tetracarboxylic dianhydride having a fluorine atom in the molecule thereof or a diamine having a fluorine atom in the molecule thereof, a polyimide resin having low refractive index is obtained from the polyamic acid, and the refractive index of the polyimide resin is lowered using it. The refractive index difference can appropriately be regulated by regulating the proportions of these materials.

In the optical waveguide of the invention, the polyimide resin obtained from the photosensitive polyimide resin precursor composition according to the invention is used to the core layer. The undercladding layer and overcladding layer are not limited to the polyimide resin so long as they have a refractive index lower than the core layer, and other resin materials can be used However, it is preferable to use the polyimide resin as a material for both the core layer and the cladding layer from the standpoint of heat resistance.

The production process of a channel type optical waveguide as one example of the optical waveguide will be described below.

Figure 3A:
FIG. 3 is a flow chart showing production steps (A) to (D) of a channel type optical waveguide according to the invention.
Figure 3B:
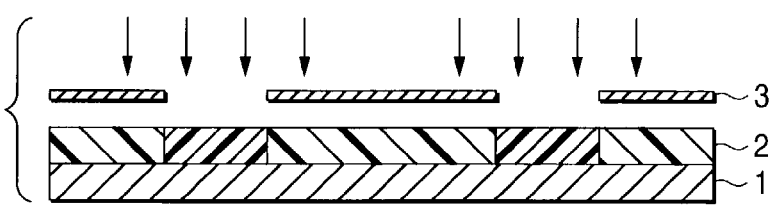
Figure 3C:
Figure 3D:
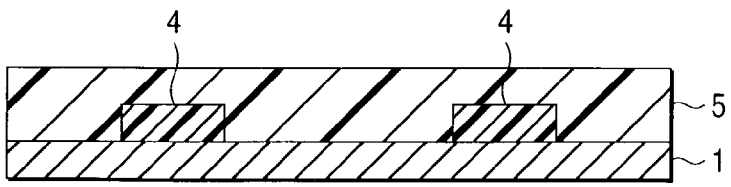

As shown in FIG. 3A, a substrate 1 is coated with a photosensitive polyimide resin precursor composition which gives a polyimide resin having a refractive index higher than that of the substrate 1, and the coating is dried to form a resin film 2 comprising the photosensitive polyimide resin precursor composition. As shown in FIG. 3B, a glass mask 3 is placed on the resin film 2 so as to obtain a desired pattern, followed by irradiation with a UV light from the upper side. After the exposure, the resin film 2 is heated, developed with a developing solution and processed into a prescribed pattern, followed by heating and curing (imidating) to form a pattern comprising the polyimide resin as a core layer 4 as shown in FIG. 3C. As shown in FIG. 3D, an overcladding layer 5 comprising a material having a refractive index lower than that of the core pattern layer 4 is formed on the core pattern layer 4. Thus, a channel type optical waveguide can be obtained.

Figure 4A:
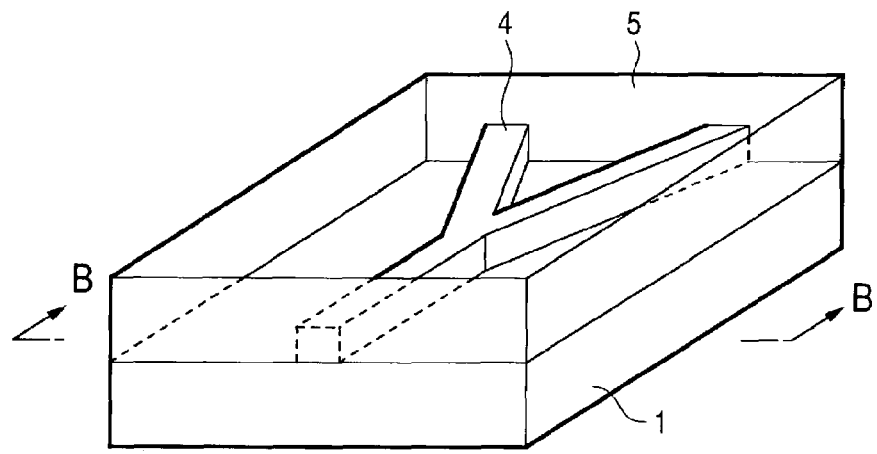
FIG. 4A is a perspective view showing a branched optical waveguide.
Figure 4B:
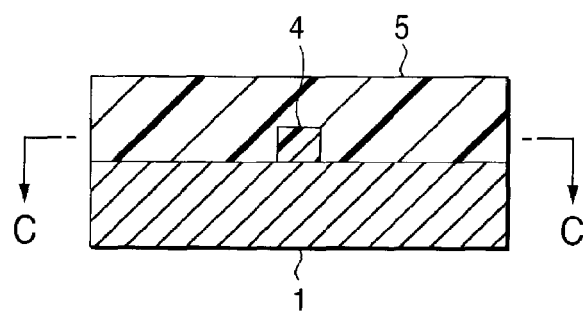
FIG. 4B is a cross-sectional view taken along B—B line of FIG. 4A.
Figure 4C:
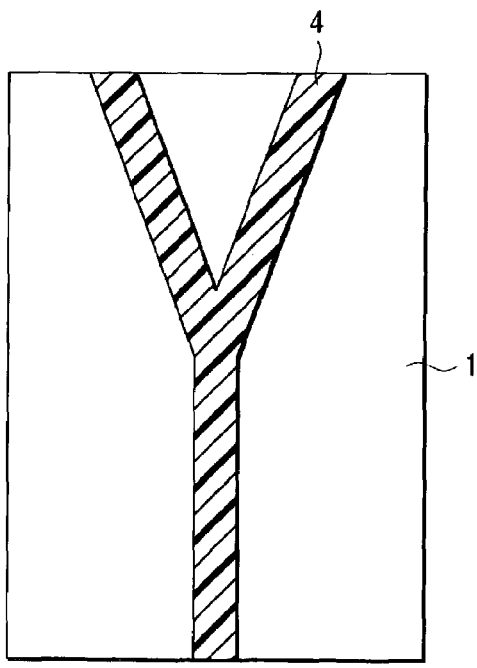
FIG. 4C is a cross-sectional view taken along C—C line of FIG. 4B.

A specific example of the channel type optical waveguide is, for example, a Y-branched optical waveguide which is provided with the core layer 4 having a Y-shape pattern, the core layer being included by the overcladding layer 5, as shown in FIGS. 4A to 4C.

The preparation method of a optical waveguide in another embodiment will be described with reference to the drawings.

Figure 5A:
FIG. 5 is a flow chart showing production steps (A) to (F) of an optical waveguide in another embodiment according to the invention.
Figure 5B:
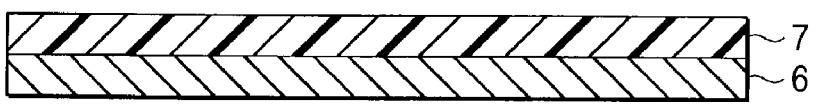
Figure 5C:
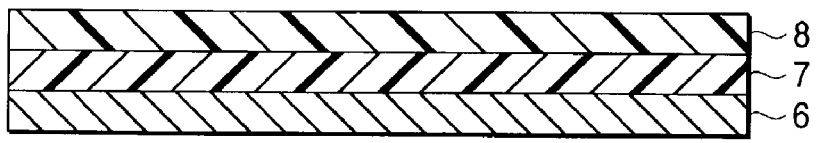
Figure 5D:
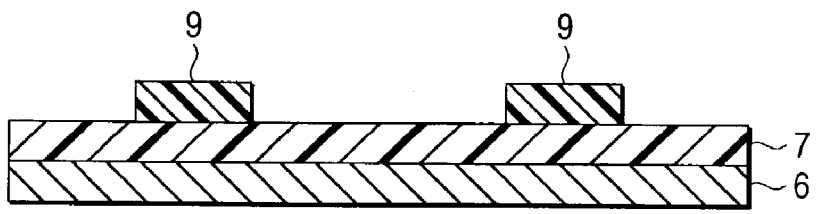
Figure 5E:
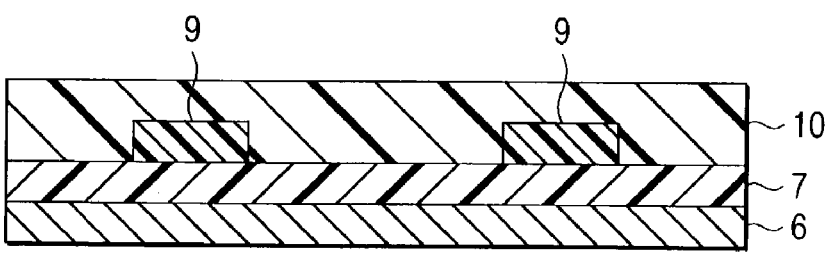
Figure 5F:
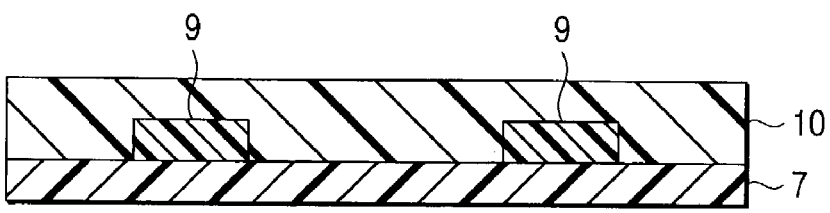

As shown in FIG. 5A, a substrate 6 comprising a material that can be etched in the final step and can be peeled apart from an undereladding layer as described later is provided. As shown in FIG. 5B, an undercladding layer 7 is formed on the substrate 6. As shown in FIG. 5C, a resin film 8 comprising the photosensitive polyimide resin precursor composition of the invention which gives a polyimide resin having a refractive index higher than that of the undercladding layer 7 is formed on the undercladding layer 7. Similar to the case of the production process of the channel type optical waveguide, a glass mask is placed on the resin film 8 so as to obtain a desired pattern; the resin film 8 is irradiated with a UV light from the upper side; and after the exposure, the resin film 8 is heated, developed with a developing solution and processed into a prescribed pattern, followed by heating and curing (imidating) to form a pattern comprising the polyimide resin as a core layer 9 as shown in FIG. 5D. As shown in FIG. 5E, an overcladding layer 10 comprising a material having a refractive index lower than that of the core layer 9 is formed on the core layer 9. The substrate 6 is removed by etching. Thus, a flexible optical waveguide from which the rigid substrate has been removed can be obtained as shown in FIG. 5F.

In the production of the flexible optical waveguide, the material for forming the substrate 6 is not particularly limited, but any material can be used so far as it can be removed by etching. Examples of such materials that can be used include metals, inorganic materials, and organic films.

The material for forming the undercladding layer 7 and the material for forming the overcladding layer 10 may be the same or different. The photosensitive polyimide resin precursor composition of the invention from which the photosensitive compound has been removed can be used as the materials for forming these cladding layers.

The invention will be described in more detail below with reference to the following Examples and Comparative Examples, but it should not be construed that the invention is limited thereto.

EXAMPLE 1

In a 500 ml separable flask, 16.7 g (0.05 moles) of 2,2-bis(4-aminophenyl) hexafluoropropane (BAAF) was dissolved in 155.6 g of N,N-dimethylacetamide (DMAc) in a nitrogen atmosphere. 22.2 g (0.05 moles) of 2,2-bis(3,4-dicarboxyphenyl)hexafluoropropane dianhydride was added to this solution with stirring, and the resulting mixture was additionally stirred at room temperature for 24 hours to prepare a polyamic acid solution.

0.019 g (0.05 parts by weight per 100 parts by weight of the polyamic acid (solids content) of the polyamic acid solution) of EDHP (photosensitive compound) and 5.8 g (15 parts by weight per 100 parts by weight of the polyamic acid of the polyamic acid solution) of polyethylene glycol dimethyl ether having a weight average molecular weight of 500 were added to this polyamic acid solution to obtain a photosensitive polyimide resin precursor composition as a solution.

The solution of the photosensitive polyimide resin precursor composition was applied to a synthetic quartz substrate having a thickness of 1.0 mm by spin coating and dried at 90° C. for about 15 minutes to form a resin film comprising the photosensitive polyimide resin precursor composition. A glass mask in which a 70 mm-long pattern having a line width of 7 μm was drawn at a pitch of 50 μm was placed on the resin film. The resin film was irradiated with a UV light of 10 mJ/m$^2$ from the upper side and then heated (after the exposure) at 170° C. for 10 minutes. The resulting resin film was developed with a 1.5 wt % aqueous solution of tetramethylammonium hydroxide as a developing solution at 35° C. and rinsed with water to form a core layer comprising a prescribed pattern. The core layer was heated at 380° C. for 2 hours in vacuo to remove the solvent from the core layer and complete imidation (curing) of the polyamic acid. The thickness of the resulting core layer comprising the pattern of the polyimide resin was measured by a contact type surface roughness meter and found to be 6.8 μm.

Separately, in order to form an overcladding layer on the core layer, equimolar amounts of trifluoromethylpyromellitic acid dianhydride and 2,2'-bis(trifluoromethyl)-4,4'-diaminodiphenyl were reacted with each other in a solvent to prepare a polyamic acid solution which gives a polyimide resin having a refractive index lower than that of the polyimide resin of the core layer.

This polyamic acid solution was applied on the core layer by spin coating and then heated at 380° C. for 2 hours in vacuo to form an overcladding layer. Thus, an channel type optical waveguide was obtained. The optical waveguide was subjected to end face processing and measured for light propagation loss by a cut-back method by passing a light having a wavelength of 1,300 nm. As a result, the optical waveguide had a light. propagation loss of 1.3 dB/cm.

EXAMPLE 2

A channel type optical waveguide was obtained in the same manner as in Example 1, except that 2 parts by weight of the photosensitive compound (EDHP) per 100 parts by weight of the polyamic acid (solids content) was used. This optical waveguide was measured for light propagation loss in the same manner as in Example 1. As a result, the optical waveguide had a light propagation loss of 1.4 dB/cm.

EXAMPLE 3

A channel type optical waveguide was obtained in the same manner as in Example 1, except that 4 parts by weight per 100 parts by weight of the polyamic acid (solids content) of the photosensitive compound (EDHP) was used. This optical waveguide was measured for light propagation loss in the same manner as in Example 1. As a result, the optical waveguide had a light propagation loss of 1.6 dB/cm.

EXAMPLE 4

A photosensitive polyimide resin precursor composition was obtained as a solution in the same manner as in Example 1, except that 4 parts by weight of the photosensitive compound (EDHP) and 10 parts by weight of polyethylene glycol dimethyl ether were used, each per 100 parts by weight of the polyamic acid (solids content).

The solution of the photosensitive polyimide resin precursor composition was applied on a thermally oxidized film-provided silicon wafer by spin coating and dried by heating at 90° C. for about 15 minutes to form an 8 μm-thick resin film comprising the photosensitive polyimide resin precursor composition. The resin film was irradiated with a UV light through a glass mask, exposed, heated and then developed to obtain a 6 μm-thick core layer comprising a prescribed pattern in the same manner as in Example 1. The film remainder rate as defined below was 75%.

[{(thickness (μm) of resin film before irradiation)−(thickness (μm) of resin film after development)}/(thickness (μm) of resin film before irradiation)]×100 (%)

EXAMPLE 5

A photosensitive polyimide resin precursor composition was obtained as a solution in the same manner as in Example 1, except that 4 parts by weight of the photosensitive compound (EDHP) and 15 parts by weight of polyethylene glycol dimethyl ether were used, each per 100 parts by weight of the polyamic acid (solids content). Using the solution of the photosensitive polyimide resin precursor composition, an 8 μm-thick resin film was formed, and the resin film was irradiated with a UV light, exposed, heated and then developed in the same manner as in Example 4 to obtain a 7.5 μm-thick core layer comprising a prescribed pattern. The film remainder rate was 94%.

EXAMPLE 6

A photosensitive polyimide resin precursor composition was obtained as a solution in the same manner as in Example 1, except that 4 parts by weight of the photosensitive compound (EDHP) and 20 parts by weight of polyethylene glycol dimethyl ether were used, each per 100 parts by weight of the polyamic acid (solids content). Using the solution of the photosensitive polyimide resin precursor composition, an 8 μm-thick resin film was formed, and the resin film was irradiated with a UV light, exposed, heated and then developed in the same manner as in Example 4 to obtain a 6.5 μm-thick core layer comprising a prescribed pattern. The film remainder rate was 81%.

COMPARATIVE EXAMPLE 1

A photosensitive polyimide resin precursor composition was obtained as a solution in the same manner as in Example 1, except that only 4 parts by weight of the photosensitive compound (EDHP) was used, per 100 parts by weight of the polyamic acid (solids content). Using the solution of the photosensitive polyimide resin precursor composition, an 8 μm-thick resin film was formed, and the resin film was irradiated with a UV light, exposed, heated and then developed in the same manner as in Example 4 to obtain a 1.5 μm-thick core layer comprising a prescribed pattern. The film remainder rate was 19%.

COMPARATIVE EXAMPLE 2

A photosensitive polyimide resin precursor composition was obtained as a solution in the same manner as in Example 1, except that 4 parts by weight of the photosensitive compound (EDHP) and 60 parts by weight of polyethylene glycol dimethyl ether were used, each per 100 parts by weight of the polyamic acid (solids content). Using the solution of the photosensitive polyimide resin precursor composition, an 8 μm-thick resin film was formed in the same manner as in Example 4.

This resin film was irradiated with a UV light, exposed and then heated in the same manner as in Example 4. The resin film was observed. As a result, it was confirmed that phase separation occurred. When the resin film was developed, a contrast between an exposed area and an unexposed area could not be obtained, so that a required pattern could not be obtained.

EXAMPLE 7

In a 300 ml separable flask, 8.81 g (0.04 moles) of 2,2'-difluorobenzidine (FBZ) was dissolved in 79.7 g of N,N-dimethylacetamide (DMAc) in a nitrogen atmosphere. 17.8 g (0.04 moles) of 2,2-bis(3,4-dicarboxyphenyl) hexafluoropropane dianhydride (6FDA) was added to this solution with stirring, and the resulting mixture was additionally stirred at room temperature for 24 hours to prepare a polyamic acid solution.

2 parts by weight of a photosensitive compound (EDHP) and 15 parts by weight of polyethylene glycol dimethyl ether having a weight average molecular weight of 500, per 100 parts by weight of the polyamic acid (solids content) of the polyamic acid solution, were added to this polyamic acid solution to obtain a photosensitive polyimide resin precursor composition as a solution.

The solution of the photosensitive polyimide resin precursor composition was applied to a synthetic quartz substrate having a thickness of 1.0 mm by spin coating and dried at 90° C. for about 15 minutes to form a resin film comprising the photosensitive polyimide resin precursor composition. A glass mask in which a 70 mm-long pattern having a line width of 6 μm was drawn at a pitch of 100 μm was placed on the resin film. The resin film was irradiated with a UV light of 10 mJ/m$^2$ from the upper side and then heated at 170° C. for 10 minutes. The thus obtained resin film had a thickness after exposure of 8.0 μm.

The resulting resin film was developed with an ethanol/alkaline aqueous solution containing tetramethylammonium hydroxide as a developing solution at 35° C. and rinsed with water to form a core layer having a required pattern. The thus obtained resin film had a thickness of 7.0 µm.

The core layer was heated at 380° C. for 2 hours in vacuo to remove the solvent from the core layer and complete imidation of the polyamic acid. The thickness of the resulting core layer comprising the pattern of the polyimide resin was measured by a contact type surface roughness meter and found to be 6.3 µm.

Separately, in order to form an overcladding layer on the core layer, equimolar amounts of 2,2-bis(3,4-dicarboxyphenyl)hexafluoropropane dianhydride (6FDA) and 2,2'-bis(4-aminophenyl)hexafluoropropane (BAAF) were reacted with each other in a solvent to prepare a polyamic acid solution which gives a polyimide resin having a refractive index lower than that of the polyimide resin of the core layer.

This polyamic acid solution was applied on the core layer by spin coating and then heated at 380° C. for 2 hours in vacuo to form an overcladding layer. Thus, an channel type optical waveguide was obtained. The optical waveguide was subjected to end face processing and measured for light propagation loss by the cut-back method by passing a light having a wavelength of 1,300 nm. As a result, the optical waveguide had a light propagation loss of 0.7 dB/cm.

EXAMPLE 8

A channel type optical waveguide was obtained in the same manner as in Example 7, except that 4 parts by weight of the photosensitive compound (EDHP) was used, per 100 parts by weight of the polyamic acid (solids content). This optical waveguide was measured for light propagation loss in the same manner as in Example 7. As a result, the optical waveguide had a light propagation loss of 1.1 dB/cm.

EXAMPLE 9

A channel type optical waveguide was obtained in the same manner as in Example 7, except that 0.5 parts by weight of the photosensitive compound (EDHP) was used, per 100 parts by weight of the polyamic acid (solids content). This optical waveguide was measured for light propagation loss in the same manner as in Example 7. As a result, the optical waveguide had a light propagation loss of 0.6 dB/cm.

EXAMPLE 10

A photosensitive polyimide resin precursor composition was obtained as a solution in the same manner as in Example 7, except that 20 parts by weight, per 100 parts by weight of the polyamic acid (solids content), of polyethylene glycol having a weight average molecular weight of 200 was used as the dissolution controlling agent in place of the polyethylene glycol dimethyl ether. A channel type optical waveguide was obtained in the same manner as in Example 7, except for using the thus obtained solution of the photosensitive polyimide resin precursor composition. This optical waveguide was measured for light propagation loss in the same manner as in Example 7. As a result, the optical waveguide had a light propagation loss of 0.7 dB/cm.

COMPARATIVE EXAMPLE 3

A photosensitive polyimide resin precursor composition was obtained as a solution in the same manner as in Example 7, except that 6 parts by weight of the photosensitive compound (EDHP) was used, per 100 parts by weight of the polyamic acid (solids content). Using the solution of the photosensitive polyimide resin precursor composition, a channel type optical waveguide was obtained in the same manner as in Example 7. This optical waveguide was measured for light propagation loss in the same manner as in Example 7. As a result, the optical waveguide had a light propagation loss of 3.0 dB/cm.

COMPARATIVE EXAMPLE 4

A photosensitive polyimide resin precursor composition was obtained as a solution in the same manner as in Example 7, except that the dissolution controlling agent was not used. Using the solution of the photosensitive polyimide resin precursor composition, it was tried to form a pattern comprising the polyamide in the same manner as in Example 7. However, in the development step, contrast was insufficient so that the resulting core layer had a film thickness of 2 µm.

Using the thus obtained core layer, an optical waveguide was prepared in the same manner as in Example 7. With respect to this optical waveguide, it was tried to measure its light propagation loss by the cut-back method, but the light was not guided.

EXAMPLE 11

In a 500 ml separable flask, 16.0 g (0.05 moles) of 2,2'-(trifluoromethyl)-4,4'-diaminobiphenyl (TFMB) was dissolved in 152.8 g of N,N-dimethylacetamide (DMAc) in a nitrogen atmosphere. 22.2 g (0.05 moles) of 2,2-bis(3,4-dicarboxyphenyl)hexafluoropropane dianhydride (6FDA) was added to this solution with stirring, and the resulting mixture was additionally stirred at room temperature for 24 hours to prepare a polyamic acid solution.

1.0 part by weight (0.38 g) of a photosensitive compound (EDHP) and 15 parts by weight (5.73 g) of polyethylene glycol dimethyl ether having a weight average molecular weight of 500, each per 100 parts by weight of the polyamic acid (solids content) of the polyamic acid solution, were added to this polyamic acid solution to obtain a photosensitive polyimide resin precursor composition as a solution.

The polyamic acid solution was applied to a synthetic quartz substrate having a thickness of 1.0 mm by spin coating, dried at 90° C. for about 15 minutes, and then heated at 380° C. for 2 hours in vacuo to cure (imidate) the polyamic acid. The thus obtained polyimide film had a thickness of 10 µm. The polyimide film was used as an undercladding layer of a optical waveguide.

The photosensitive polyimide resin precursor composition was applied on the undercladding layer by spin coating and then dried at 90° C. for about 15 minutes to form a resin film comprising the photosensitive polyimide resin precursor composition. A glass mask in which a 70 mm-long pattern having a line width of 8 µm was drawn at a pitch of 50 µm was placed on the resin film. The resin film was irradiated with a UV light of 10 mJ/m$^2$ from the upper side and then heated (after exposure) at 180° C. for 10 minutes. The resulting resin film was developed with a 5 wt % aqueous solution containing tetramethylammonium hydroxide as a developing solution at 35° C. and rinsed with water to form a core layer of an optical waveguide comprising a prescribed pattern. The core layer was heated at 360° C. for 2 hours in vacuo to remove the solvent from the core layer and complete imidation (curing) of the polyamic acid. The thickness of the resulting core layer comprising the pattern of the polyimide resin was measured by a contact type surface roughness meter and found to be 6.5 μm.

This polyamic acid solution was applied on the core layer by spin coating and then heated at 380° C. for 2 hours in vacuo to form an overcladding layer having a thickness of 20 μm. Thus, a channel type optical waveguide was obtained. The optical waveguide was subjected to end face processing by using a dicing device and measured for light propagation loss by the cut-back method by passing a light having a wavelength of 1,550 nm. As a result, the optical waveguide had a light propagation loss of 0.8 dB/cm.

EXAMPLE 12

In a 500 ml separable flask, 11.0 g (0.05 moles) of 2,2'-difluorobenzidine (FBZ) was dissolved in 132.8 g of N,N-dimethylacetamide (DMAc) in a nitrogen atmosphere. 22.2 g (0.05 moles) of 2,2-bis(3,4-dicarboxyphenyl)hexafluoropropane dianhydride (6FDA) was added to this solution with stirring, and the resulting mixture was additionally stirred at room temperature for 24 hours to prepare a polyamic acid solution.

1.0 part by weight of a photosensitive compound (EDHP) and 15 parts by weight of polyethylene glycol dimethyl ether having a weight average molecular weight of 500, each per 100 parts by weight of the polyamic acid (solids content), were added to this polyamic acid solution to obtain a photosensitive polyimide resin precursor composition as a solution.

A channel type optical waveguide was obtained in the same manner as in Example 11, except that this photosensitive polyimide resin precursor composition was used for the formation of a core layer. This optical waveguide was measured for light propagation loss in the same manner as in Example 11. As a result, the optical waveguide had a light propagation loss of 0.9 dB/cm.

EXAMPLE 13

In a 500 ml separable flask, 8.0 g (0.025 moles) of 2,2'-bis(trifluromethyl)-4,4'-diaminobiphenyl (TFMB) and 5.0 g (0.025 moles) of 4,4'-oxydianiline (ODA) were dissolved in 14.08 g of N,N-dimethylacetamide (DMAc) in a nitrogen atmosphere. 22.2 g (0.05 moles) of 2,2-bis(3,4-dicarboxyphenyl)hexafluoropropane dianhydride (6FDA) was added to this solution with stirring, and the resulting mixture was additionally stirred at room temperature for 24 hours to prepare a polyamic acid solution.

1.0 part by weight of a photosensitive compound (EDHP) and 15 parts by weight of polyethylene glycol dimethyl ether having a weight average molecular weight of 500, each per 100 parts by weight of the polyamic acid (solids content), were added to this polyamic acid solution to obtain a photosensitive polyimide resin precursor composition as a solution.

A channel type optical waveguide was obtained in the same manner as in Example 11, except that this photosensitive polyimide resin precursor composition was used for the formation of a core layer. This optical waveguide was measured for light propagation loss in the same manner as in Example 11. As a result, the optical waveguide had a light propagation loss of 0.9 dB/cm.

EXAMPLE 14

In a 500 ml separable flask, 16.0 g (0.05 moles) of 2,2'-bis(trifluoromethyl)-4,4'-diaminobiphenyl (TFMB) was dissolved in 130.2 g of N,N-dimethylacetamide (DMAc) in a nitrogen atmosphere. 11.1 g (0.025 moles) of 2,2-bis(3,4-dicarboxyphenyl)hexafluoropropane dianhydride (6FDA) and 5.45 g (0.025 moles) of pyromellitic acid dianhydride (PMDA) were simultaneously added to this solution with stirring, and the resulting mixture was additionally stirred at room temperature for 24 hours to prepare a polyamic acid solution.

1.0 part by weight of a photosensitive compound (EDHP) and 15 parts by weight of polyethylene glycol dimethyl ether having a weight average molecular weight of 500, each per 100 parts by weight of the polyamic acid (solids content), were added to this polyamic acid solution to obtain a photosensitive polyimide resin precursor composition as a solution.

A channel type optical waveguide was obtained in the same manner as in Example 11, except that this photosensitive polyimide resin precursor composition was used for the formation of a core layer. This optical waveguide was measured for light propagation loss in the same manner as in Example 11. As a result, the optical waveguide had a light propagation loss of 0.8 dB/cm.

EXAMPLE 15

In a 500 ml separable flask, 16.0 g (0.05 moles) of 2,2'-bis(trifluoromethyl)-4,4'-diaminobiphenyl (TFMB) was dissolved in 13.94 g of N,N-dimethylacetamide (DMAc) in a nitrogen atmosphere. 11.1 g (0.025 moles) of 2,2-bis(3,4-dicarboxyphenyl)hexafluoropropane dianhydride (6FDA) and 7.76 g (0.025 moles) of bis(3,4-dicarboxyphenyl)ether dianhydride (OPDA) were simultaneously added to this solution with stirring, and the resulting mixture was additionally stirred at room temperature for 24 hours to prepare a polyamic acid solution.

1.0 part by weight of a photosensitive compound (EDHP) and 15 parts by weight of polyethylene glycol dimethyl ether having a weight average molecular weight of 500, each per 100 parts by weight of the polyamic acid (solids content), were added to this polyamic acid solution to obtain a photosensitive polyimide resin precursor composition as a solution.

A channel type optical waveguide was obtained in the same manner as in Example 11, except that this photosensitive polyimide resin precursor composition was used for the formation of a core layer. This optical waveguide was measured for light propagation loss in the same manner as in Example 11. As a result, the optical waveguide had a light propagation loss of 1.1 dB/cm.

EXAMPLE 16

In a 500 ml separable flask, 16.0 g (0.05 moles) of 2,2'-bis(trifluoromethyl)-4,4'-diaminobiphenyl (TFMB) was dissolved in 137.8 g of N,N-dimethylacetamide (DMAc) in a nitrogen atmosphere. 11.1 g (0.025 moles) of 2,2-bis(3,4-dicarboxyphenyl)hexafluoropropane dianhydride (6FDA) and 7.4 g (0.025 moles) of 3,3',4,4'-biphenyltetracarboxylic acid dianhydride (BPDA) to this polyamic acid solution to this solution with stirring, and the resulting mixture was additionally stirred at room temperature for 24 hours to prepare a polyamic acid solution.

1.0 part by weight of a photosensitive compound (EDHP) and 15 parts by weight of polyethylene glycol dimethyl ether having a weight average molecular weight of 500, each per 100 parts by weight of the polyamic acid (solids content), were added to this polyamic acid solution to obtain a photosensitive polyimide resin precursor composition as a solution.

A channel type optical waveguide was obtained in the same manner as in Example 11, except that this photosensitive polyimide resin precursor composition was used for the formation of a core layer. This optical waveguide was measured for light propagation loss in the same manner as in Example 11. As a result, the optical waveguide had a light propagation loss of 1.1 dB/cm.

EXAMPLE 17

In a 500 ml separable flask, 8.0 g (0.025 moles) of 2,2'-bis(trifluoromethyl)-4,4'-diaminobiphenyl (TFMB) and 8.4 g (0.025 moles) of 2,2-bis(4-aminophenyl)hexafluoropropane (BIS-A-AF) were dissolved in 154.3 g of N,N-dimethylacetamide (DMAc) in a nitrogen atmosphere. 22.2 g (0.05 moles) of 2,2-bis(3,4-dicarboxyphenyl)hexafluoropropane dianhydride (6FDA) was added to this solution with stirring, and the resulting mixture was additionally stirred at room temperature for 24 hours to prepare a polyamic acid solution.

An channel type optical waveguide was obtained in the same manner as in Example 11, except that the foregoing polyamic acid varnish was used for the formation of an undercladding layer and an overcladding layer and that the photosensitive polyimide resin precursor composition as prepared in Example 11 was used for the formation of a core layer. This optical waveguide was measured for light propagation loss in the same manner as in Example 11. As a result, the optical waveguide had a light propagation loss of 0.9 dB/cm.

EXAMPLE 18

A channel type optical waveguide was obtained in the same manner as in Example 11, except that 3 parts by weight of the photosensitive compound (EDHP) was used, per 100 parts by weight of the polyamic acid (solids content). This optical waveguide was measured for light propagation loss in the same manner as in Example 11. As a result, the optical waveguide had a light propagation loss of 1.1 dB/cm.

EXAMPLE 19

A channel type optical waveguide was obtained in the same maimer as in Example 11, except that 0.05 parts by weight of the photosensitive compound (EDHP) was used, per 100 parts by weight of the polyamic acid (solids content). This optical waveguide was measured for light propagation loss in the same manner as in Example 11. As a result, the optical waveguide had a light propagation loss of 0.8 dB/cm.

EXAMPLE 20

A channel type optical waveguide was obtained in the same manner as in Example 11, except that polypropylene glycol dimethyl ether having a weight average molecular weight of 500 was used in place of the polyethylene glycol dimethyl ether. This optical waveguide was measured for light propagation loss in the same manner as in Example 11. As a result, the optical waveguide had a light propagation loss of 0.8 dB/cm.

EXAMPLE 21

A photosensitive polyimide resin precursor composition was obtained as a solution in the same manner as in Example 11, except that 1.0 part of the photosensitive compound (EDHP) and 30 parts by weight of polyethylene glycol dimethyl ether having a weight average molecular weight of 500 were used, each per 100 parts by weight of the polyamic acid (solids content).

The solution of the polyamic acid solution as prepared in Example 11 was applied to a synthetic quartz substrate having a thickness of 1.0 mm by spin coating, dried at 90° C. for about 15 minutes, and then heated at 360° C. for 2 hours in vacuo, to cure (imidate) the polyamic acid. The thus obtained polyimide film had a thickness of 10 μm. The polyimide film was used as an undercladding layer of a optical waveguide.

The photosensitive polyimide resin precursor composition was applied to the undercladding layer by spin coating and then dried at 90° C. for about 15 minutes to form a resin film comprising the photosensitive polyimide resin precursor composition. A glass mask in which a 70 mm-long pattern having a line width of 8 μm was drawn at a pitch of 50 μm was placed on the resin film. The resin film was irradiated with a UV light of 10 mJ/m² from the upper side and then heated (after exposure) at 180° C. for 10 minutes. Subsequently, the resulting resin film was developed with a 5 wt % aqueous solution containing tetramethylammonium hydroxide as a developing solution at 35° C. and rinsed with water to form a core layer of an optical waveguide comprising a prescribed pattern. The core layer had a film remainder rate of 80%. Further, the shape of the cross-section of the core layer was examined and found to be a square with a bottom angle of 88–90°. Thereafter, the core layer was heated at 360° C. for 2 hours in vacuo to remove the solvent from the core layer and complete imidation (curing) of the polyamic acid.

The same polyamic acid solution as used for the formation of the undercladding layer was applied to the core layer by spin coating, followed by heating at 360° C. for 2 hours in vacuo to form an overcladding layer having a thickness of 20 μm. Thus, an channel type optical waveguide was obtained. The optical waveguide was subjected to end face processing by using a dicing device and measured for light propagation loss by the cut-back method by passing a light having a wavelength of 1,550 nm. As a result, the optical waveguide had a light propagation loss of 0.5 dB/cm.

EXAMPLE 22

A polyamic acid solution and a photosensitive polyimide resin precursor composition were prepared in the same manner as in Example 11, except that 30 parts by weight of polypropylene glycol having a weight average molecular weight of 300 was used as the dissolution controlling agent in place of the polyethylene glycol dimethyl ether. Using these materials, an optical waveguide was prepared in the same manner as in Example 11, and then measured for film remainder rate, bottom angle of the core layer and light propagation loss of the optical waveguide, and found to be 85%, 88–90° and 0.5 dB/cm, respectively.

EXAMPLE 23

A polyamic acid solution and a photosensitive polyimide resin precursor composition were prepared in the same manner as in Example 11, except that 30 parts by weight of polypropylene glycol diphenyl ether having a weight average molecular weight of 400 was used as the dissolution controling agent in place of the polyethylene glycol dimethyl ether. Using these materials, an optical waveguide was prepared in the same manner as in Example 11, and then measured for film remainder rate, bottom angle of the core layer and light propagation loss of the optical waveguide and found to be 80%, from 88 to 90° and 0.5 dB/cm, respectively.

COMPARATIVE EXAMPLE 5

A channel type optical waveguide was obtained in the same manner as in Example 11, except that 7 parts by weight of the photosensitive compound (EDHP) was used, per 100 parts by weight of the polyamic acid (solids content). This optical waveguide was measured for light propagation loss in the same manner as in Example 11. As a result, the optical waveguide had a light propagation loss of 2.4 dB/cm.

COMPARATIVE EXAMPLE 6

It was tried to obtain a channel type optical waveguide in the same manner as in Example 11, except that 0.005 parts by weight of the photosensitive compound (EDHP) was used, per 100 parts by weight of the polyamic acid (solids content). However, during the development, a contrast between an exposed area and an unexposed area could not be obtained, so that a core pattern of an optical waveguide could not be formed.

COMPARATIVE EXAMPLE 7

It was tried to obtain a channel type optical waveguide in the same manner as in Example 11, except that 60 parts by weight of polyethylene glycol dimethyl ether was used, per 100 parts by weight of the polyamic acid (solids content). However, phase separation occurred within the polyamic acid film at the stage of heating after exposure, and a pattern having a desired resolution could not be obtained, so that a core pattern of an optical waveguide could not be formed.

COMPARATIVE EXAMPLE 8

It was tried to obtain a channel type optical waveguide in the same manner as in Example 11, except that 3 parts by weight of polyethylene glycol dimethyl ether having a weight average molecular weight of 500 was used, per 100 parts by weight of the polyamic acid (solids content). However, during the development, a contrast between an exposed area and an unexposed area could not be obtained, so that a core pattern of an optical waveguide could not be formed.

COMPARATIVE EXAMPLE 9

The polyamic acid solution the same as in Example 11 was applied to a synthetic quartz substrate having a thickness of 1.0 mm by spin coating, dried at 90° C. for about 15 minutes, and then heated at 360° C. for 2 hours in vacuo, to cure (imidate) the polyamic acid. The thus obtained polyimide film had a thickness of 10 μm. The polyimide film was used as an undercladding layer of an optical waveguide.

The same photosensitive polyimide resin precursor composition as in Example 11 was applied to the undercladding layer by spin coating and then dried at 90° C. for about 15 minutes to form a resin film comprising the photosensitive polyimide resin precursor composition. Additionally, the core layer was heated at 360° C. for 2 hours in vacuo to remove the solvent from the core layer and complete imidation (curing) of the polyamic acid.

The core layer was processed by the conventional reactive ion etching method using oxygen plasma so as to obtain a prescribed pattern in which a 70 mm-long pattern having a line width of 8 μm was drawn at a pitch of 50 μm. The same polyamic acid solution as in the formation of the undercladding layer was applied to the bottom of the thus obtained core layer by spin coating, followed by heating at 360° C. for 2 hours in vacuo, to form an overcladding layer having a thickness of 20 μm. Thus, a channel type optical waveguide was obtained. The optical waveguide was subjected to end face processing by using a dicing device and measured for light propagation loss by the cut-back method by passing a light having a wavelength of 1,550 nm. As a result, the optical waveguide had a light propagation loss of 1.2 dB/cm.

As described above, the photosensitive polyimide resin precursor composition of the invention contains a dissolution controlling agent while containing a photosensitive compound in a smaller amount compared with the conventional composition. Accordingly, when the photosensitive polyimide resin precursor composition of the invention is exposed upon irradiation with a small dose of a UV light, heated and then developed, it is possible to obtain a polyimide resin comprising a prescribed pattern with high contrast.

Especially, when a polyamic acid obtained from a tetracarboxylic acid dianhydride and a diamine each having a fluorine atom is used as the polyamic acid which is a polyimide resin precursor, it is possible to obtain a polyimide resin that is not substantially colored, is transparent and has heat resistance and that can be suitably used as an optical resin. Accordingly, an optical waveguide having a small light propagation loss can be obtained by utilizing such a polyimide resin as a core layer.

It should further be apparent to those skilled in the art that various changes in form and detail of the invention as shown and described above may be made. It is intended that such changes be included within the spirit and scope of the claims appended hereto.

This application is based on Japanese Patent Application No.2001-389056 filed Dec. 21, 2001 and Japanese Patent Application No. 2002-208429 filed Jul. 17, 2002, the disclosures of which are incorporated herein by reference in its entireties.

What is claimed is:

1. A photosensitive polyimide resin precursor composition comprising:
   (a) 100 parts by weight of a polyamic acid obtained from a tetracarboxylic dianhydride and a diamine,
   (b) 0.01 parts by weight or more and less than 4 parts by weight of a 1,4-dihydropyridine derivative represented by the following formula (I):

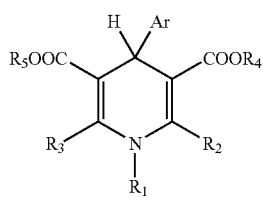
(I)

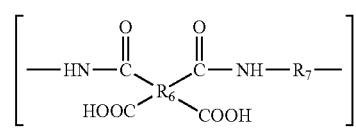
(II)

wherein $R_6$ represents at least one tetravalent group selected from the group consisting of tetravalent groups represented by the following formulae (IIa), IIb), (IIc), (IId) and (IIe):

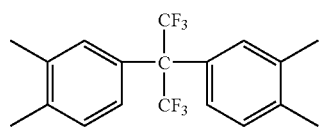
(IIa)

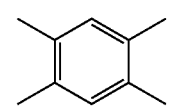
(IIb)

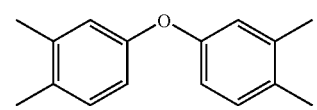
(IIc)

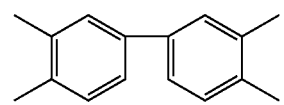
(IId)

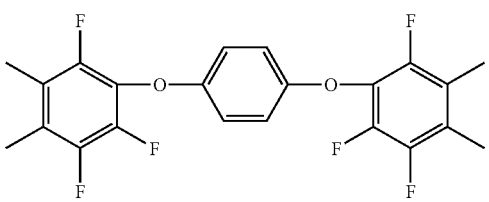
(IIe)

and $R_7$ represents at least one divalent group selected from the group consisting of divalent groups represented by the following formulae (IIf, (IIg), (IIh) and (IIi):

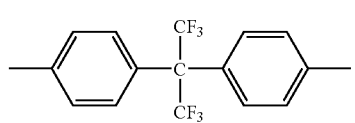
(IIf)

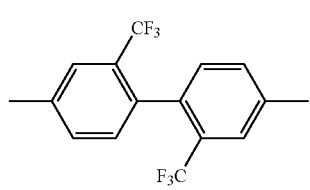
(IIg)

wherein Ar represents an aromatic group having a nitro group at ortho-position with respect to a bonding position to 1,4-dihydropyridine ring; $R_1$ represents hydrogen atom or an alkyl group having 1–3 carbon atoms; and $R_2$, $R_3$, $R_4$, and $R_5$ each independently represent hydrogen atom or an alkyl group having 1 or 2 carbon atoms, and (c) 5–50 parts by weight of at least one glycol (ether) having a weight average molecular weight of 100–3,000 selected from the group consisting of polyethylene glycol, polyethylene glycol monomethyl ether, polyethylene glycol dimethyl ether, polyethylene glycol monophenyl ether, polyethylene glycol diphenyl ether, polypropylene glycol, polypropylene glycol monomethyl ether, polypropylene glycol dimethyl ether, polypropylene glycol monophenyl ether, and polypropylene glycol diphenyl ether.

2. The photosensitive polyimide resin precursor composition as claimed in claim 1, wherein the tetracarboxylic dianhydride has a fluorine atom in the molecule thereof.

3. The photosensitive polyimide resin precursor composition as claimed in claim 2, wherein the tetracarboxylic dianhydride is selected from the group consisting of 2,2-bis(3,4-dicarboxyphenyl)hexafluoropropane dianhydride, 4,4-bis(3,4-dicarboxytrifluorophenoxy)tetrafluorobenzene dianhydride, 1,4-bis(3,4-dicarboxytrifluorophenoxy)tetrafluorobenzene dianhydride, (trifluoromethyl)pyromellitic dianhydride, di(trifluoromethy)pyromellitic dianhydride, and di(heptafluoropropyl)pyromellitic dianhydride.

4. The photosensitive polyimide resin precursor composition as claimed in claim 1, wherein the diamine has a fluorine atom in the molecule thereof.

5. The photosensitive polyimide resin precursor composition as claimed in claim 4, wherein the diamine is selected from the group consisting of 2,2'-bis(trifluoromethoxy)-4,4'-diaminobiphenyl, 3,3'-diamino-5,5'- bis(trifluoro-methyl)biphenyl, 2,2-bis(4-aminophenyl)hexafluoropropane, 2,2-bis[4-(4-aminophenoxy)phenyl]hexafluoropropane, 2,2'-bis(trifluoromethyl)-4,4'-diaminobiphenyl, 2,2-bis(3-amino-4-hydroxyphenyl)hexafluoropropane, 2,2-bis(3-amino-4-methyl-phenyl)hexafluoropropane, 2,2'-difluorobenzidine, 4,4'-bis-(aminooctafluoro)biphe 3,5-diaminobenzotrifluoride, and 1,3-diamino-2,4,5,6-tetrafluorobenzene.

6. The photosensitive polyimide resin precursor composition as claimed in claim 1, wherein the polyamic acid has a repeating unit represented by the following formula (II):

-continued

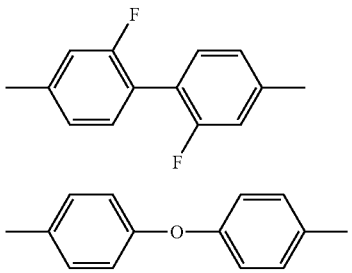

(IIh)

(IIi)

7. The photosensitive polyimide resin precursor composition as claimed in claim 1, wherein the 1,4-dihydropyridine derivative is 1-ethyl-3,5-dimethoxy-carbonyl-4-(2-nitrophenyl)-1,4,dihydropyridine.

8. The photosensitive polyimide resin precursor composition as claimed in claim 1, wherein the 1,4-dihydropyridine derivative is used in an amount of 0.05–2 parts by weight per 100 parts by weight of the polyamic acid.

9. The photosensitive polyimide resin precursor composition as claimed in claim 1, wherein the glycol (ether) has a weight average molecular weight of 100–3,000.

10. The photosensitive polyimide resin precursor composition as claimed in claim 1, wherein the glycol (ether) has a weight average molecular weight of 200–2,000.

11. The photosensitive polyimide resin precursor composition as claimed in claim 1, wherein the glycol (ether) is used in an amount of 20–40 parts by weight per 100 parts by weight of the polyamic acid.

12. An optical polyimide resin obtained by:
applying the photosensitive polyimide precursor composition as claimed in claim 1 to a surface of a substrate,
drying the coating to form a resin film comprising the photosensitive polyimide resin precursor composition,
irradiating the resin film with UV light through a mask so as to obtain a desired pattern, followed by exposure,
heating the resin film at 160–200° C. in air,
developing the resin film with a developing solution to obtain the pattern, and
heating the pattern at 300–400° C. to imidize the pattern, thereby obtaining the pattern comprising the polyimide resin.

13. An optical waveguide comprising a core layer comprising the optical polyimide resin as claimed in claim 12, and a cladding layer thereof.

14. A process for producing an optical waveguide, which comprises:
applying a photosensitive polyimide resin precursor composition comprising:
(a) 100 parts by weight of a polyamic acid obtained from a tetracarboxylic dianhydride and a diamine,
(b) 0.01 parts by weight or more and less than 4 parts by weight of a 1,4-dihydropyridine derivative represented by the following formula (I) as a photosensitive compound:
wherein Ar represents an aromatic group having a nitro group at ortho-position with respect to a bonding position to 1,4-dihydropyridine ring; $R_1$ represents hydrogen atom or an alkyl group having 1–3 carbon atoms; and $R_2$, $R_3$, $R_4$, and $R_5$ each independently represent hydrogen atom or an alkyl group having 1 or 2 carbon atoms, and
(c) 5–50 parts by weight of at least one glycol (ether) having a weight average molecular weight of 100–3,000 selected from the group consisting of polyethylene glycol, polyethylene glycol monomethyl ether, polyethylene glycol dimethyl ether, polyethylene glycol monophenyl ether, polyethylene glycol diphenyl ether, polypropylene glycol, polypropylene glycol monomethyl ether, polypropylene glycol dimethyl ether, polypropylene glycol monophenyl ether, and polypropylene glycol diphenyl ether, as a dissolution controlling agent;
on a substrate to form a photosensitive resin film,
irradiating the photosensitive resin film with a UV light through a mask, followed by exposure, heating, development, and
heating to form a core layer having a square cross-section.

* * * * *